(12) United States Patent
Takagishi

(10) Patent No.: US 8,441,316 B2
(45) Date of Patent: May 14, 2013

(54) SWITCHING SUPPLY CIRCUITS AND METHODS

(75) Inventor: Hideto Takagishi, San Jose, CA (US)

(73) Assignee: Diodes Incorporated, Plano, TX (US)

( * ) Notice: Subject to any disclaimer, the term of this patent is extended or adjusted under 35 U.S.C. 154(b) by 356 days.

(21) Appl. No.: 12/985,556

(22) Filed: Jan. 6, 2011

(65) Prior Publication Data

US 2012/0176106 A1   Jul. 12, 2012

(51) Int. Cl.
*H03F 3/217* (2006.01)

(52) U.S. Cl.
USPC .................. 330/251; 330/207 A; 330/296

(58) Field of Classification Search ............... 330/251, 330/207 A, 296
See application file for complete search history.

(56) References Cited

U.S. PATENT DOCUMENTS

| | | | |
|---|---|---|---|
| 5,161,185 A | 11/1992 | Hochschild | |
| 5,892,404 A * | 4/1999 | Tang | 330/297 |
| 6,211,728 B1 | 4/2001 | Chen et al. | |
| 6,262,632 B1 | 7/2001 | Corsi et al. | |
| 6,414,863 B1 | 7/2002 | Bayer et al. | |
| 6,614,297 B2 | 9/2003 | Score et al. | |
| 6,683,494 B2 | 1/2004 | Stanley | |
| 6,693,571 B2 | 2/2004 | Melanson et al. | |
| 6,762,704 B1 | 7/2004 | Melanson et al. | |
| 6,791,405 B2 | 9/2004 | Tsuji et al. | |
| 6,917,324 B2 | 7/2005 | Lee | |
| 7,167,046 B2 | 1/2007 | Maejima | |
| 7,183,840 B2 | 2/2007 | Maejima | |
| 7,262,658 B2 | 8/2007 | Ramaswamy et al. | |
| 7,339,425 B2 | 3/2008 | Yang | |
| 7,378,904 B2 | 5/2008 | Risbo | |
| 7,482,870 B2 | 1/2009 | Maejima et al. | |
| 7,579,910 B2 | 8/2009 | Zhang et al. | |
| 7,633,336 B2 * | 12/2009 | Bean et al. | 330/10 |
| 7,679,433 B1 * | 3/2010 | Li | 330/10 |
| 7,728,663 B2 * | 6/2010 | Rabjohn et al. | 330/124 R |
| 7,737,776 B1 | 6/2010 | Cyrusian | |
| 7,990,214 B2 * | 8/2011 | Markowski | 330/136 |
| 8,174,313 B2 * | 5/2012 | Vice | 330/127 |
| 8,212,620 B2 * | 7/2012 | Strickland et al. | 330/297 |
| 2004/0232979 A1 | 11/2004 | Edwards et al. | |
| 2006/0181346 A1 | 8/2006 | Nguyen | |
| 2008/0101628 A1 | 5/2008 | Takagishi | |
| 2008/0161953 A1 | 7/2008 | Takagishi | |
| 2011/0063027 A1 | 3/2011 | Kishii et al. | |

* cited by examiner

*Primary Examiner* — Patricia Nguyen
(74) *Attorney, Agent, or Firm* — Yingsheng Tung

(57) ABSTRACT

In one embodiment the present invention includes a switching circuit. The circuit comprises a first transistor, a second transistor, and a boost circuit. The first transistor couples a first power source to a first intermediate node during a first phase of operation and the second transistor couples a second intermediate node to the first intermediate node during a second phase of operation. The boost circuit is coupled to the second intermediate node and provides a second power source by a transferring of energy from the first power source. The transferring of energy includes an inductor receiving energy from the first power source during the first phase of operation and providing a portion of said energy to the boost circuit during the second phase of operation. The boost circuit provides a biasing to enable deactivation of the second transistor during the first phase of operation.

20 Claims, 4 Drawing Sheets

US 8,441,316 B2

SWITCHING SUPPLY CIRCUITS AND METHODS

BACKGROUND

Particular embodiments generally relate to switching circuits, and in a particular example, to class D amplifier supply circuits and methods.

Portable devices require more efficient circuits to extend battery power for longer periods of time. Cellular phones and personal digital assistants (PDAs) use low voltage and switching control circuits to improve power efficiency. Portable devices may use class D amplifiers that use switching to efficiently generate music and voice.

FIG. 1 illustrates a conventional single ended class D amplifier system 100. System 100 includes a class D amplifier 101 that receives an input and generates a switching signal at a node A. Class D amplifier 101 produces the switching signal at point A by switching between the voltage rails (e.g., Vdd and ground). This switching signal may be filtered by a filter 102 (e.g., an inductor 106 and a capacitor 108) to produce a power signal at the output node appropriate for driving a speaker 104.

Some applications require the single ended class D amplifier configuration, as shown in FIG. 1, to generate audio using a single battery 105 (e.g., lithium ion battery) having a voltage Vdd. The nominal output voltage of class D amplifier 101 will be between the supply voltage Vdd and ground and requires a large direct current (DC) coupling capacitor 103 at an output node. DC coupling capacitor 103 may degrade the low frequency response of class D amplifier system 100. Also, capacitor 103 may be very large and may increase the footprint of a portable application.

Some applications may use complimentary supplies so that an output capacitor is not needed. However, additional supplies require additional circuitry incorporating a great deal of active devices that may consume more power and use more space. These circuits may also be designed for a specific voltage and restrict flexibility in application design.

SUMMARY

In one embodiment the present invention includes a switching circuit. In one embodiment, the present invention includes a circuit comprising a first transistor that couples a first power source to a first intermediate node during a first phase of operation, a second transistor that couples a second intermediate node to the first intermediate node during a second phase of operation, and a boost circuit coupled to the second intermediate node and providing a second power source by a transferring of energy from the first power source. The transferring of energy includes an inductor, coupled between the first intermediate node and an output load, receiving energy from the first power source during the first phase of operation and providing a portion of said energy to the boost circuit during the second phase of operation, where the boost circuit provides a biasing to enable deactivation of the second transistor during the first phase of operation.

In one embodiment, the circuit further comprises a switching control circuit coupled to drive the second transistor using a signal corresponding to an immediate value of the second power source.

In one embodiment, the switching control circuit drives the first and second transistors, at least in part, in response to a first signal from the first intermediate node and a second signal from the second intermediate node.

In one embodiment, the switching control circuit includes an input terminal that receives an input signal, wherein the switching control circuit drives the activation of the first and second transistors in response to the first signal, the input signal, and the second signal.

In one embodiment, the second power source provides a voltage complimentary to a voltage provided by the first power source, and in accordance therewith, increases a capability of said circuit to provide a higher momentary power delivery and less direct current to said output load.

In one embodiment, the second power source includes a capacitor charged with the portion of said energy.

In one embodiment, the boost circuit includes a diode coupled between said second intermediate node and a reference voltage, wherein said diode and reference voltage provide a second biasing during at least one cycle of the first phase of operation.

In one example embodiment, the present invention includes a system comprising a class D amplifier having an input terminal coupled to receive an input signal, an output terminal coupled to an output load through an inductor, and a first supply terminal coupled to a first power source, and a boost circuit coupled to a second supply terminal of said class D amplifier and providing a second power source by a transferring of energy from the first power source, wherein the transferring of energy includes the inductor receiving energy from the first power source during the first phase of operation and providing a portion of said energy to the boost circuit during the second phase of operation, and wherein the boost circuit provides a biasing to enable operation of said class D amplifier during the first phase of operation.

In one embodiment, the class D amplifier includes a drive circuit that responds to a signal corresponding to the second power source.

In one embodiment, a switching of the class D amplifier is responsive to a first signal from the output terminal and a second signal from the second supply terminal In one embodiment, the switching of the class D amplifier responds to changes in the first signal, the input signal, and the second signal.

In one embodiment, the second power source provides a voltage complimentary to a voltage provided by the first power source, and in accordance therewith, increases a capability of said circuit to provide a higher momentary power delivery and less direct current to said output load.

In one embodiment, the second power source includes a capacitor charged with the portion of said energy.

In one embodiment, the boost circuit includes a diode coupled between said output terminal and a reference voltage, wherein said diode and reference voltage provide said biasing during at least one cycle of the second phase of operation.

In another embodiment, the present invention includes a method comprising activating a first transistor to couple a first power source to a first intermediate node during a first phase of operation, activating a second transistor to couple a second intermediate node to the first intermediate node during a second phase of operation, biasing from a boost circuit to enable deactivation of the second transistor during the first phase of operation, and providing a second power source from the boost circuit to the second intermediate node by a transferring of energy from the first power source, wherein the transferring of energy includes an inductor, coupled between the first intermediate node and an output load, receiving energy from the first power source during the first phase of operation and providing a portion of said energy to the boost circuit during the second phase of operation.

In one embodiment, the deactivation of the second transistor includes driving a signal on a control terminal of said second transistor, wherein the signal corresponds to an immediate value of the second power source.

In one embodiment, the activating of the first and second transistors includes, at least in part, responding to a first signal from the first intermediate node and a second signal from the second intermediate node.

In one embodiment, the method further comprises receiving an input signal at an input terminal, wherein the activating of the first and second transistors is responsive to the first signal, the input signal, and the second signal.

In one embodiment, the providing the second power source includes providing a voltage complimentary to a voltage provided by the first power source, and in accordance therewith, increases a capability of said circuit to provide a higher momentary power delivery and less direct current to said output load.

In one embodiment, the method further comprises charging a capacitor with the portion of said energy in response to the activating of the second transistor.

The following detailed description and accompanying drawings provide a better understanding of the nature and advantages of the present invention.

DETAILED DESCRIPTION

Described herein are techniques for switching supply circuits and methods. In the following description, for purposes of explanation, numerous examples and specific details are set forth in order to provide a thorough understanding of the present invention. It will be evident, however, to one skilled in the art that the present invention as defined by the claims may include some or all of the features in these examples alone or in combination with other features described below, and may further include modifications and equivalents of the features and concepts described herein.

Figure 1:
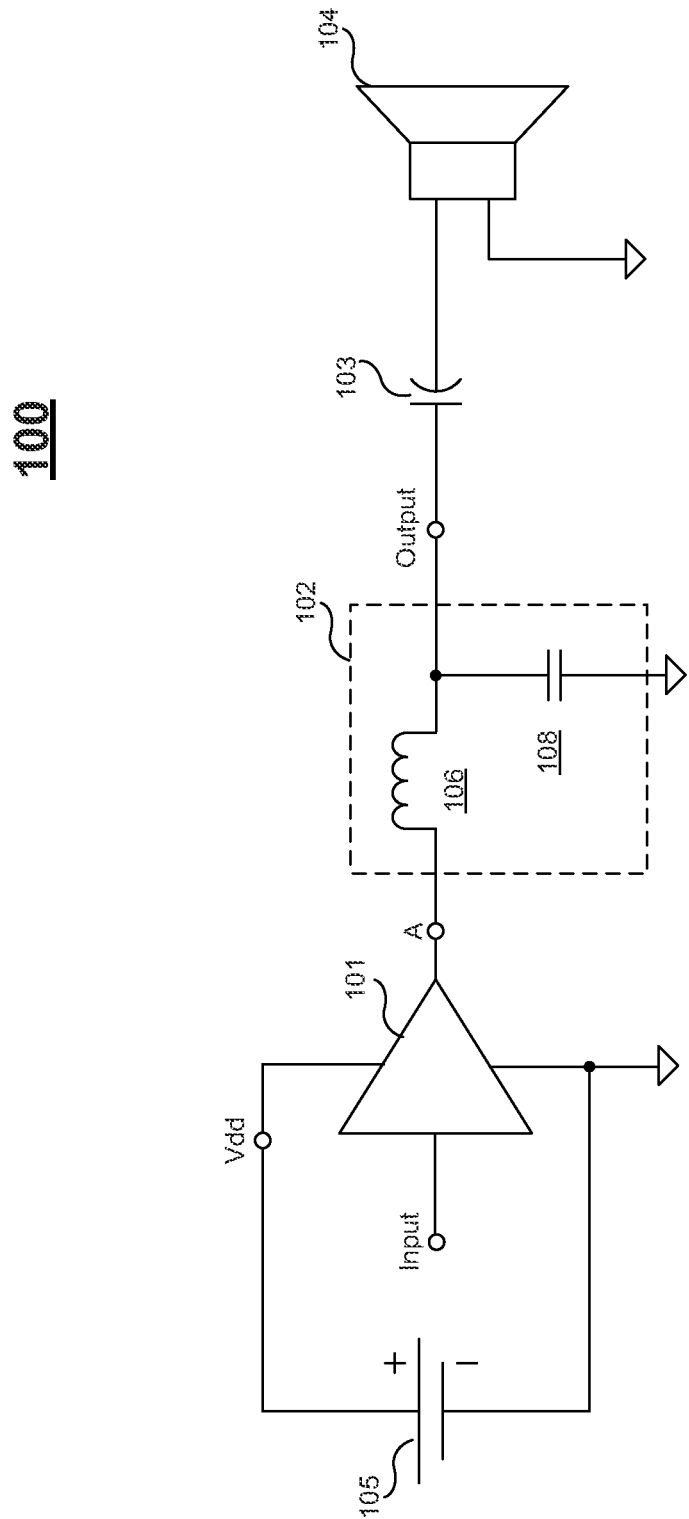
FIG. 1 illustrates a prior art single ended class D amplifier system.
Figure 2:
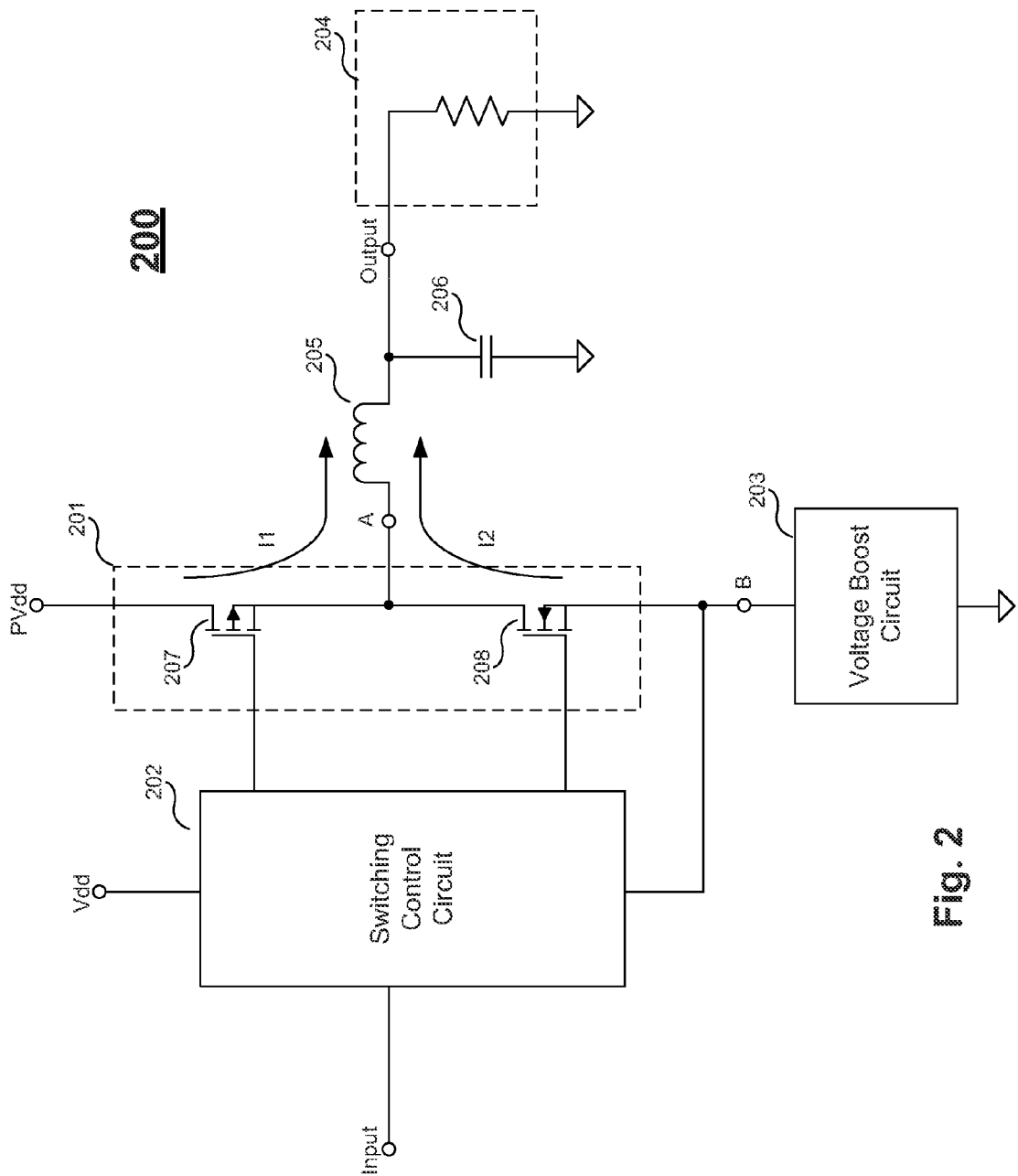
FIG. 2 illustrates a circuit according to one embodiment of the present invention.

FIG. 2 illustrates a circuit 200 according to one embodiment. Circuit 200 includes an output stage 201, a switching control circuit 202, a voltage boost circuit 203, an output load 204, an inductor 205, and a capacitor 206. Switching control circuit 202 receives an input signal at an input node and drives output stage 201 to output a corresponding switching signal at an intermediate node A. Intermediate node A is coupled to output load 204 through inductor 205. Capacitor 206 is coupled between an output node and ground. Inductor 205 and capacitor 206 operate as a low pass filter to convert the switching signal at intermediate node A to a continuous power signal appropriate for driving output load 204 at the output node.

Output stage 201 has a first supply terminal coupled to a power source PVdd and a second supply terminal coupled to an intermediate node B. Switching control circuit 202 has a first supply terminal coupled to a power source Vdd and a second supply terminal coupled to an intermediate node B. Boost circuit 203 provides power to output stage 201 and switching control circuit 202 through intermediate node B. Circuit 200 includes a second power source at intermediate point B from energy provided by the first power source PVdd to boost circuit 203.

Switching control circuit 202 controls the switching of transistors 207-208 to provide an output corresponding to the input signal. In the absence of an input signal or an input signal corresponding to no signal (e.g. ~0V), the switching signal may settle to a 50% duty cycle in which each transistor 207-208 may be activated for half of a cycle.

During each cycle of operation, energy may be transferred to the boost circuit 203. During a first phase of operation, transistor 207 is on and transistor 208 is off. Transistor 207 couples power source PVdd to intermediate node A with transistor 208 deactivated. Current I1 flows from power supply PVdd through transistor 208, intermediate node A, and inductor 205. At this time, inductor 205 receives energy from power source PVdd.

During a second phase of operation, transistor 207 is off and transistor 208 is on. Transistor 208 couples intermediate node B to intermediate node A with transistor 207 deactivated. Current I2 flows from voltage boost circuit 203 through intermediate node B, transistor 208, intermediate node A, and inductor 205. Inductor 205 provides a portion of the energy to boost circuit 203 during the second phase of operation. The first and second phase of operation may be repeated each cycle to transfer more energy to boost circuit 203. The transfer of energy continues until current I2 decreases the voltage at intermediate point B to a voltage complimentary to the voltage provided by power source PVdd.

Boost circuit 203 acts as a second power source and provides the complimentary voltage to intermediate node B. At a no-input or low-input condition, less direct current passes to the output load 204. The average current through inductor 205 may settle to approximately zero such that DC coupling is no longer required between the output node and output load 204. Also, the complimentary voltage at intermediate node B increases a capability of circuit 200 to provide a higher momentary power delivery. The dynamic range of the output may be nearly doubled and the momentary power may be quadrupled. The second power source provided by boost circuit 203 may fluctuate according to power demands corresponding to the magnitude of the input signal and the amount of momentary power required.

Switching control circuit 202 is coupled to intermediate node B to respond to fluctuations in the immediate voltage provided by boost circuit 203. Because of the fluctuations, a drive signal is scaled to activate and deactivate transistor 208 according to the immediate voltage provided by boost circuit 203. For example, transistor 208 may have a source terminal coupled to intermediate node B and a control terminal coupled to receive drive signals from switching control circuit 202. Switching control circuit 202 may provide a drive signal corresponding to the immediate value of the second power source provided by boost circuit 203. As the immediate voltage value at intermediate node B fluctuates or otherwise changes, the drive signal also track these changes to have proper drive voltages to activate and deactivate transistor 208. For example, during the first phase of operation, the drive signal may be scaled according to the gate voltage required to deactivate transistor 208. Also, during startup conditions, switching control circuit 202 may provide a signal corresponding to a biasing from boost circuit 203 to enable activation of transistor 208 when the voltage at intermediate node B is close to zero volts.

Figure 3:
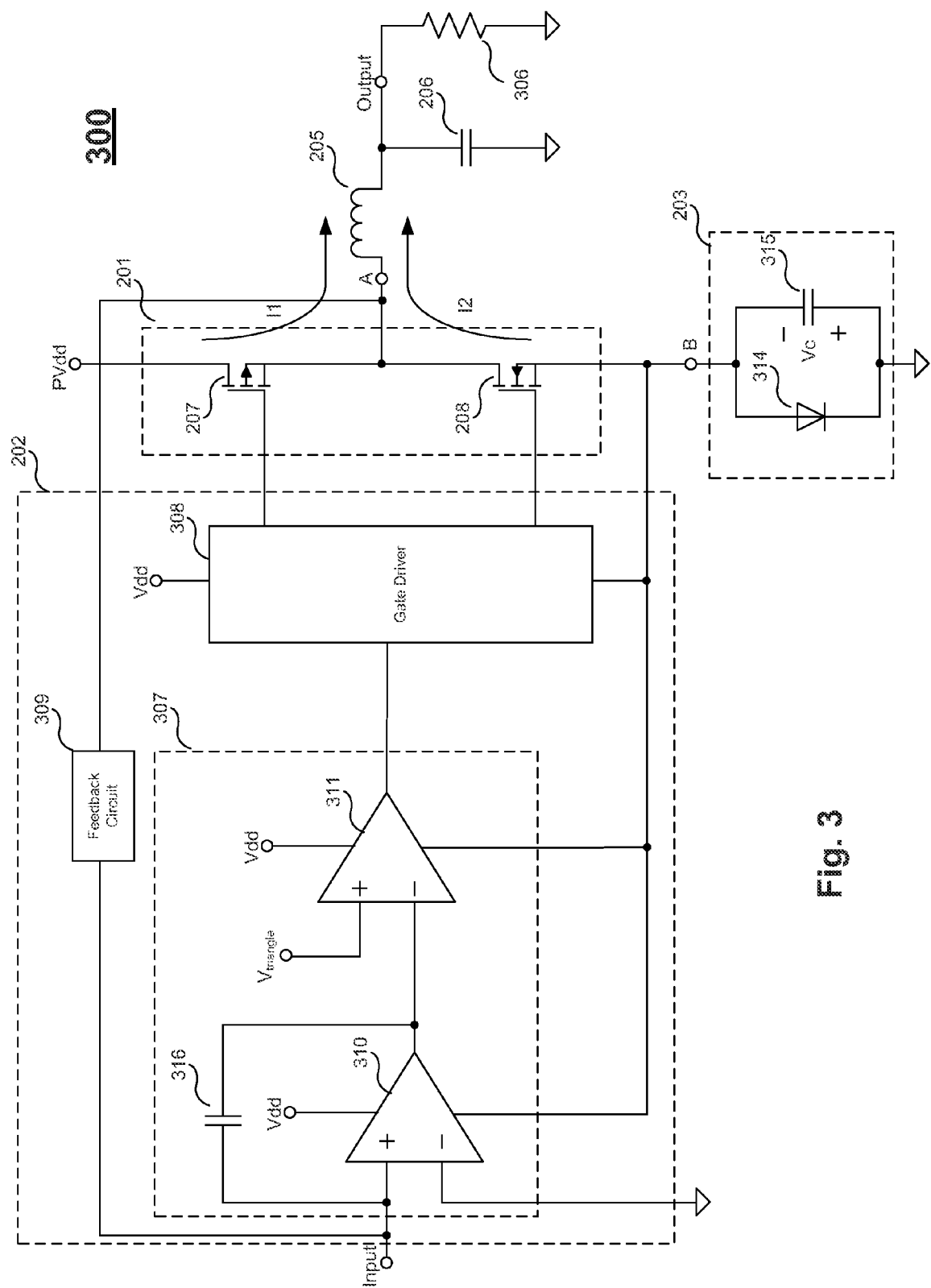
FIG. 3 illustrates an example class D amplifier system according to another embodiment of the present invention.

FIG. 3 illustrates an example class D amplifier system 300 according to another embodiment of the present invention.

Class D amplifier system 300 includes switching control circuit 202, output stage 201, boost circuit 203, inductor 205, capacitor 206, and output load resistor 306.

Switching control circuit 202 receives an input signal and drives output stage 201 to output a corresponding switching signal at intermediate node A. Intermediate node A is coupled to the output load through inductor 205. Capacitor 206 is coupled between the output node and ground. Inductor 205 and capacitor 206 operate as a low pass filter to convert the switching signal at intermediate node A to a continuous power signal appropriate for driving output load 306. The Class D amplifier system 300 provides a switching signal corresponding to a ground referenced input signal.

Switching control circuit 202 provides the timing of the switching signal. Switching control circuit includes an input modulator 307, a gate driver 308, and a feedback circuit 309. Input modulator 307 is coupled to receive a first power source Vdd and a second power source from boost circuit 203, and input modulator 307 receives an input signal and a feedback signal from intermediate node A through feedback circuit 309. Input modulator 307 includes an amplifier 310, a comparator 311, and a capacitor 316. Capacitor 316 is coupled between an input terminal and an output terminal of amplifier 310 to integrate the input signal and feedback signal. The resultant integrated signal is received by comparator 311 and compared with a triangular waveform (Vtriangle) to generate a pulse width modulated (PWM) signal.

Gate driver 308 receives the PWM signal and provides drive signals to each control terminal of transistors 207 and 208. Transistors 207 and 208 alternatively switch to provide the switching signal at intermediate node A. The switching signal provides both a current corresponding to the input signal and a current to charge boost circuit 203 to the negative voltage complementary to the value of voltage provided by power source PVdd. In this manner, class D amplifier system 300 may provide a second power source having a complimentary voltage at intermediate point B from energy provided by the first power source PVdd.

Boost circuit 203 may be the second power source. Boost circuit 203 includes a diode 314 and a capacitor 315 coupled in parallel and located between intermediate node B and a reference voltage (e.g. ground). Diode 314 may have an anode terminal coupled to intermediate node B to bias a source terminal of transistor 208 during the initial startup of system 300. Diode 314 and the ground reference voltage may provide this startup biasing during at least one cycle of the first phase of operation. The second power source includes capacitor 315, which is charged with the portion of the energy transferred from inductor 205 during the second phase of operation (as described above). Once charged, capacitor 315 may provide power to output stage 201 and switching control circuit 202.

Boost circuit 203 operates similar to what was described in FIG. 2. System 300 may cycle through a first and second phase, which may charge boost circuit 203 to a complimentary voltage at intermediate node B. During a first phase of operation, transistor 207 couples power source PVdd to intermediate node A. Current may flow from power source PVdd and transfer energy to inductor 205. During a second phase of operation, transistor 208 couples intermediate node B to intermediate node A. Current may flow from inductor 205 and transfer energy to boost circuit 203, which may negatively charge capacitor 315. A portion of current I2 flows from the boost circuit through inductor 205 thereby charging capacitor 315 to a negative voltage Vc at intermediate node B.

In one embodiment, switching control circuit 202 drives transistors 207-208 according to feedback. Gate driver 308 may drive, at least in part, in response to a first signal from intermediate node A and a second signal from intermediate node B. Feedback circuit 309 couples the first signal back to the input terminal of modulator 307 and intermediate node B couples the second signal from boost circuit 203 to the negative supply terminal of both the modulator circuit 307 and gate driver 308. Switching control circuit 202 includes an input terminal that receives an input signal and switching control circuit 202 may drive the activation of transistors 207-208 in response to the first signal, the input signal, and the second signal. The feedback may stabilize the output signal according the reference voltage (e.g. reference ground) provided to amplifier 310.

Figure 4:
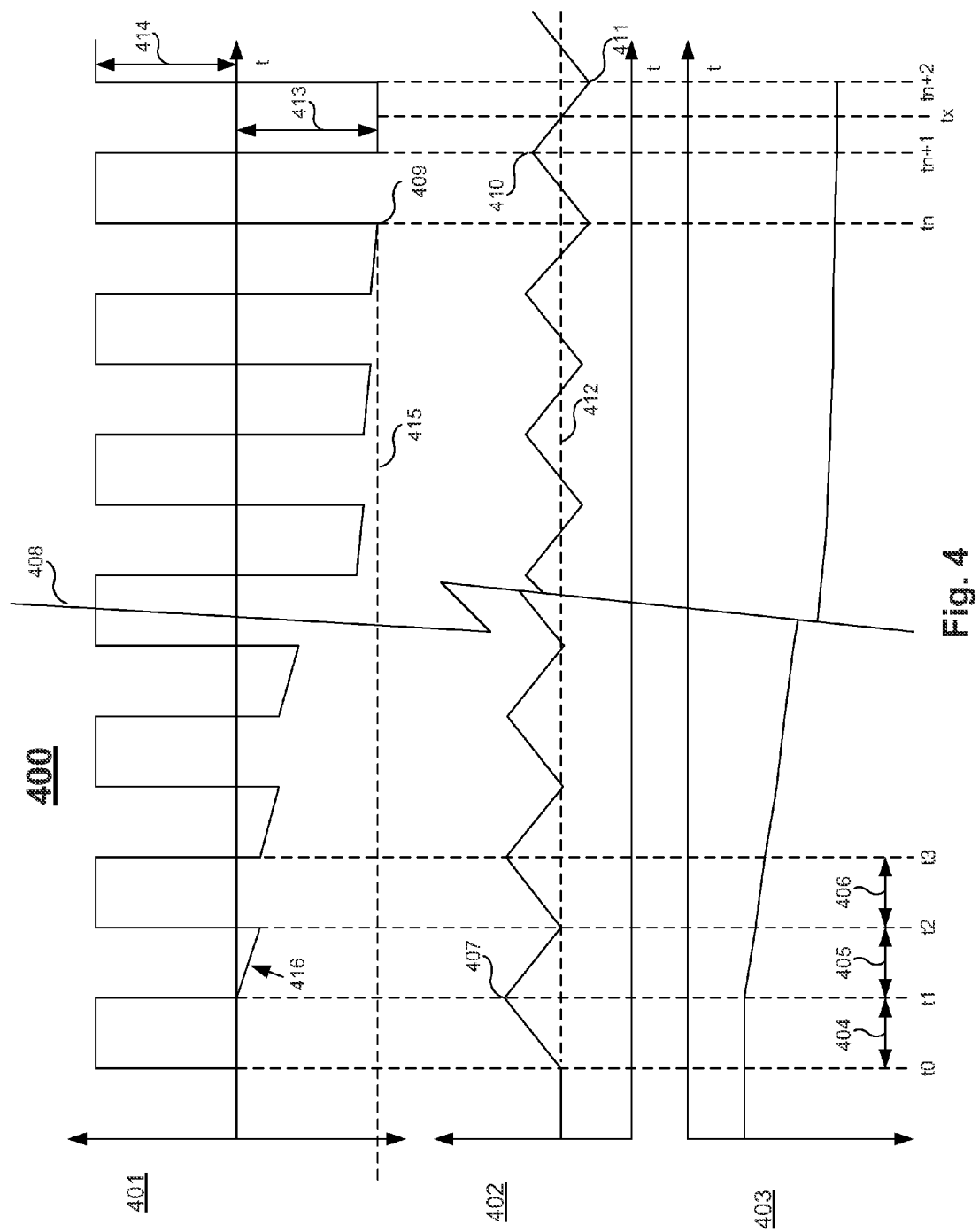
FIG. 4 illustrates a graph showing waveforms associated with one embodiment of the present invention.

FIG. 4 illustrates a graph 400 showing waveforms 401-403 according to one embodiment. Graphs 400 depict the charging of the second power source during an initial power up of a circuit similar to circuit 200 of FIG. 2 or a system similar to system 300 of FIG. 3. Waveform 401 depicts the switching signal at intermediate node A (FIG. 2 or 3), waveform 402 depicts current passing through the inductor (e.g. inductor 205), and waveform 403 depicts the signal at intermediate node B (FIG. 2 or 3). Waveform 401-403 illustrate signals that demonstrate possible power-on cycles when the class D amplifier has no input and boost circuit 203 is being charged from energy from the main power source (e.g. PVdd).

Phase one and phase two may occur every cycle. During an exemplary first phase 404, the current through inductor 205 integrates up to peak value 407 and during an exemplary second phase 405, the current integrates down as energy is transferred from inductor 205 to the second power source. Time period 406 represents another exemplary first phase repeating during the next cycle.

An exemplary cycle begins at time t0. At time point t0, the first transistor (e.g. transistors 207) is activated to couple the main power source (e.g. PVdd) to a first intermediate node (e.g. node A) during a first phase of operation (e.g. first phase 404). At time point t0, the second transistor 208 may be deactivated. At t0, switching waveform 401 goes to the main voltage rail (e.g. PVdd) and inductor current waveform 402 begins to increase. After time period 404, inductor current waveform 402 has reached a peak value 407 and first transistor 207 is deactivated.

At time point t1, second transistor 208 is activated to couple second intermediate node B to first intermediate node A during a second phase of operation (e.g. time period 405). During time period 405, the second power source voltage integrates negatively at location 416. As described above in regard to FIG. 3, the inductor current flows (e.g. I1 and I2 of FIG. 3) one direction in the inductor 205 and when the lower switch is activated a portion of the current flows from boost circuit 203 through inductor 205 thereby charging capacitor 315 to a negative voltage Vc at intermediate node B. This integration for the second phase of every cycle (e.g. time period 405) allows for a larger dynamic range for the input signal. In this example, the PWM signal is a 50% duty cycle and almost all the energy is being transferred to boost circuit 203. Second supply waveform 403 shows the voltage charging down.

After multiple cycles, at point 409, boost circuit 203 is charged to a complementary voltage level 415. The absolute value of a voltage 413 is approximately equal to the absolute value of a voltage 414. The resultant dynamic range is approximately double because of the second power source provided by boost circuit 203. The dynamic range may increase the capability of a circuit or system to delivery higher momentary power. The final point 409 may vary in time in practice.

At the fully charged point 409, the average inductor current is zero. During time periods 404-406, the average current is above zero, but as the second power source is charged, the inductor current waveform 402 adjusts and the average current adjusts to approximately zero milliamps. The average voltage at the output is the average of positive voltage rail and the negative voltage rail provided by switching waveform 401. During an initial time periods 404-405, the average of switching voltage waveform 401 will be approximately one half voltage 414, which corresponds to a positive average of inductor current waveform 402 during this same time period. During periods 405-406, the negative voltage rail has integrated slightly in the negative direction thereby shifting the average of switching voltage waveform 401 lower and thereby shifting the average of inductor current waveform 402 lower. This process of lowering the average of both the switching voltage waveform 401 and the inductor current waveform 402 continues during the time frame of the waveforms 401-403 until time point tn.

At time point tn, an exemplary first phase begins and inductor current waveform 402 increases to peak current 410. At time point tn+1, an exemplary second phase begins and the inductor current waveform 402 decreases to negative peak value 411. At time point tx, the magnitude of the negative rail voltage 413 matches the magnitude of the positive rail voltage 414. At time point tx the average voltage is approximately zero volts and the average current is approximately zero milliamps. Peak point 410 is approximately as far above zero current line 412 as point 411 is below the zero current line. The average current is approximately 0 ma because the output load (e.g. resistor 306 of FIG. 3) is reference to ground and the output average voltage is approximately 0V. Less direct current passes to the output load.

Since approximately no DC current passes to the load, there is no need for a DC blocking capacitor at the output. Without a DC blocking capacitor, a class D amplifier has a better low frequency response because the response does not depend on the size and quality of the DC blocking capacitor. Another added advantage is that the second source has provided a magnitude of voltage 413 approximately equal to the magnitude of the voltage 414 provided by the main power source, thereby doubling the dynamic range of the output voltage. Since power $P=V^2/R$ and now $V=2V$ (i.e. double the voltage range), then the power has been quadrupled.

$$P=(2V)^2/R=4(V^2/R)$$

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. Based on the above disclosure and the following claims, other arrangements, embodiments, implementations and equivalents will be evident to those skilled in the art and may be employed without departing from the spirit and scope of the invention as defined by the claims.

What is claimed is:

1. A circuit comprising:
a first transistor that couples a first power source to a first intermediate node during a first phase of operation;
a second transistor that couples a second intermediate node to the first intermediate node during a second phase of operation; and
a boost circuit coupled to the second intermediate node and providing a second power source by a transferring of energy from the first power source,
wherein the transferring of energy includes an inductor, coupled between the first intermediate node and an output load, receiving energy from the first power source during the first phase of operation and providing a portion of said energy to the boost circuit during the second phase of operation, and
wherein the boost circuit provides a biasing to enable deactivation of the second transistor during the first phase of operation.

2. The circuit of claim 1 further comprising a switching control circuit coupled to drive the second transistor using a signal corresponding to an immediate value of the second power source.

3. The circuit of claim 2 wherein the switching control circuit drives the first and second transistors, at least in part, in response to a first signal from the first intermediate node and a second signal from the second intermediate node.

4. The circuit of claim 3 wherein said switching control circuit includes an input terminal that receives an input signal, wherein the switching control circuit drives the activation of the first and second transistors in response to the first signal, the input signal, and the second signal.

5. The circuit of claim 1 wherein the second power source provides a voltage complimentary to a voltage provided by the first power source, and in accordance therewith, increases a capability of said circuit to provide a higher momentary power delivery and less direct current to said output load.

6. The circuit of claim 1 wherein the second power source includes a capacitor charged with the portion of said energy.

7. The circuit of claim 1 wherein the boost circuit includes a diode coupled between said second intermediate node and a reference voltage, wherein said diode and reference voltage provide a second biasing during at least one cycle of the first phase of operation.

8. A system comprising:
a class D amplifier having an input terminal coupled to receive an input signal, an output terminal coupled to an output load through an inductor, and a first supply terminal coupled to a first power source; and
a boost circuit coupled to a second supply terminal of said class D amplifier and providing a second power source by a transferring of energy from the first power source,
wherein the transferring of energy includes the inductor receiving energy from the first power source during the first phase of operation and providing a portion of said energy to the boost circuit during the second phase of operation, and
wherein the boost circuit provides a biasing to enable operation of said class D amplifier during the first phase of operation.

9. The circuit of claim 8 wherein the class D amplifier includes a drive circuit that responds to a signal corresponding to the second power source.

10. The circuit of claim 8 wherein a switching of the class D amplifier is responsive to a first signal from the output terminal and a second signal from the second supply terminal.

11. The circuit of claim 10 wherein the switching of the class D amplifier responds to changes in the first signal, the input signal, and the second signal.

12. The circuit of claim 8 wherein the second power source provides a voltage complimentary to a voltage provided by the first power source, and in accordance therewith, increases a capability of said circuit to provide a higher momentary power delivery and less direct current to said output load.

13. The circuit of claim 8 wherein the second power source includes a capacitor charged with the portion of said energy.

14. The circuit of claim 8 wherein the boost circuit includes a diode coupled between said output terminal and a reference voltage, wherein said diode and reference voltage provide said biasing during at least one cycle of the second phase of operation.

15. A method comprising:
- activating a first transistor to couple a first power source to a first intermediate node during a first phase of operation;
- activating a second transistor to couple a second intermediate node to the first intermediate node during a second phase of operation;
- biasing from a boost circuit to enable deactivation of the second transistor during the first phase of operation; and
- providing a second power source from the boost circuit to the second intermediate node by a transferring of energy from the first power source,
- wherein the transferring of energy includes an inductor, coupled between the first intermediate node and an output load, receiving energy from the first power source during the first phase of operation and providing a portion of said energy to the boost circuit during the second phase of operation.

16. The method of claim 15 wherein the deactivation of the second transistor includes driving a signal on a control terminal of said second transistor, wherein the signal corresponds to an immediate value of the second power source.

17. The method of claim 16 wherein the activating of the first and second transistors includes, at least in part, responding to a first signal from the first intermediate node and a second signal from the second intermediate node.

18. The method of claim 16 further comprising receiving an input signal at an input terminal, wherein the activating of the first and second transistors is responsive to the first signal, the input signal, and the second signal.

19. The method of claim 15 wherein the providing the second power source includes providing a voltage complimentary to a voltage provided by the first power source, and in accordance therewith, increases a capability of said circuit to provide a higher momentary power delivery and less direct current to said output load.

20. The method of claim 15 further comprising charging a capacitor with the portion of said energy in response to the activating of the second transistor.

* * * * *